United States Patent
Sanuki et al.

(10) Patent No.: US 12,190,966 B2
(45) Date of Patent: Jan. 7, 2025

(54) MEMORY SYSTEM AND PROCESSING METHOD OF MEMORY SYSTEM

(71) Applicant: KIOXIA CORPORATION, Tokyo (JP)

(72) Inventors: Tomoya Sanuki, Yokkaichi Mie (JP); Hitomi Tanaka, Tokyo (JP); Tatsuro Hitomi, Yokohama Kanagawa (JP); Yasuhito Yoshimizu, Kawasaki Kanagawa (JP); Masayuki Miura, Tokyo (JP); Yoshihiro Ohba, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 198 days.

(21) Appl. No.: 17/899,447

(22) Filed: Aug. 30, 2022

(65) Prior Publication Data
US 2023/0282289 A1 Sep. 7, 2023

(30) Foreign Application Priority Data
Mar. 1, 2022 (JP) .................. 2022-031020

(51) Int. Cl.
G11C 16/26 (2006.01)
G11C 16/04 (2006.01)
G11C 16/34 (2006.01)
H10B 43/00 (2023.01)

(52) U.S. Cl.
CPC .......... *G11C 16/26* (2013.01); *G11C 16/0483* (2013.01); *G11C 16/34* (2013.01); *G11C 16/3431* (2013.01); *H10B 43/00* (2023.02)

(58) Field of Classification Search
CPC ..... G11C 16/26; G11C 16/0483; G11C 16/34; G11C 16/3431; H10B 43/00; H10B 41/27; H10B 43/27; G06F 3/0658; G06F 3/0659; G06F 3/0679
See application file for complete search history.

(56) References Cited

U.S. PATENT DOCUMENTS

| 9,875,062 B2 | 1/2018 | Yadav et al. |
| 10,289,343 B2 | 5/2019 | Yadav et al. |
| 10,467,134 B2 * | 11/2019 | Kankani ............. G06F 12/0246 |

(Continued)

FOREIGN PATENT DOCUMENTS

TW 201344692 A 11/2013

OTHER PUBLICATIONS

Ma, Xiaolei et al., "Charge-assisted Recovery and Degradation in Charge-trapping 3D NAND Flash Memory, Experimental Evidences and Theoretical Perspectives," 2020 IEEE Silicon Nanoelectronics Workshop (SNW), Honolulu, HI, USA, Jun. 13-14, 2020, pp. 41-42, DOI: 10.1109/SNW50361.2020.9131627, 2 pages.

(Continued)

*Primary Examiner* — Xiaochun L Chen
(74) *Attorney, Agent, or Firm* — Kim & Stewart LLP

(57) ABSTRACT

A method of processing a memory system that includes a substrate with a connector and a semiconductor memory chip connected to the connector is provided. The method includes detaching the semiconductor memory chip from the connector, performing an annealing process with respect to the semiconductor memory chip detached from the connector, and after the annealing process, attaching the semiconductor memory chip to the connector on the substrate.

12 Claims, 11 Drawing Sheets

(56) References Cited

U.S. PATENT DOCUMENTS

| | | |
|---|---|---|
| 2005/0106814 A1 | 5/2005 | Shin |
| 2013/0163175 A1 | 6/2013 | Kim et al. |
| 2013/0185487 A1 | 7/2013 | Kim et al. |
| 2014/0254286 A1 | 9/2014 | Bronner et al. |
| 2017/0090822 A1 | 3/2017 | Yadav et al. |
| 2018/0060230 A1 | 3/2018 | Kankani et al. |
| 2021/0240388 A1 | 8/2021 | Hazeghi et al. |
| 2023/0188337 A1* | 6/2023 | Bert ............... G06F 3/0622 713/171 |

OTHER PUBLICATIONS

Moon, Dong-Il et al., "Sustainable Electronics for Nano-Spacecraft in Deep Space Missions," 2016 IEEE International Electron Devices Meeting (IEDM), San Francisco, CA, USA, Dec. 3-7, 2016, pp. 31.8.1-31.8.4, DOI: 10.1109/IEDM.2016.7838524, 4 pages.

Wu, Qi et al., "A First Study on Self-Healing Solid-State Drives," 2011 3rd IEEE International Memory Workshop (IMW), Monterey, CA, USA, May 22-25, 2011, DOI: 10.1109/IMW.2011.5873201, 4 pages.

Han, Jin-Woo et al., "System On Microheater for On-Chip Annealing of Defects Generated by Hot-Carrier Injection, Bias Temperature Instability, and Ionizing Radiation," IEEE Electron Device Letters, vol. 37, No. 12, Dec. 2016, pp. 1543-1546, DOI: 10.1109/LED.2016.2616133, 4 pages.

Han, Jin-Woo et al., "Monolithically Integrated Microheater for On-Chip Annealing of Oxide Defects," IEEE Electron Device Letters, vol. 38, No. 7, Jul. 2017, pp. 831-834, DOI: 10.1109/LED.2017.2700326, 4 pages.

Lue, Hang-Ting et al., "Radically Extending the Cycling Endurance of Flash Memory (to > 100M Cycles) by Using Built-in Thermal Annealing to Self-heal the Stress-induced Damage," 2012 International Electron Devices Meeting, San Francisco, CA, USA , Dec. 10-13, 2012, pp. 9.1.1-9.1.4, DOI: 10.1109/IEDM.2012.6479008, 4 pages.

Sakamoto, Hajime "Is the best heat sink for M.2 SSD a separate type? 970 EVO Plus verified cooling effect. Measure the temperature with a 3-shaped heat sink," Akiba PC Hotline!, Sep. 13, 2019, URL: https://akiba-pc.watch.impress.co.jp/docs/sp/1206795.html, 11 pages.

Hsu, Tzu-Hsuan et al., "Study of Self-Healing 3D NAND Flash with Micro Heater to Improve the Performances and Lifetime for Fast NAND in NVDIMM Applications," 2019 IEEE 11th International Memory Workshop (IMW), Monterey, CA, USA, May 12-15, 2019, DOI: 10.1109/IMW.2019.8739692, 4 pages.

* cited by examiner

MEMORY SYSTEM AND PROCESSING METHOD OF MEMORY SYSTEM

CROSS-REFERENCE TO RELATED APPLICATION(S)

This application is based upon and claims the benefit of priority from Japanese Patent Application No. 2022-031020, filed Mar. 1, 2022, the entire contents of which are incorporated herein by reference.

FIELD

Embodiments described herein relate generally to a memory system and a processing method of the memory system.

BACKGROUND

A memory system including a NAND flash memory is known.

DETAILED DESCRIPTION

Figure 1:
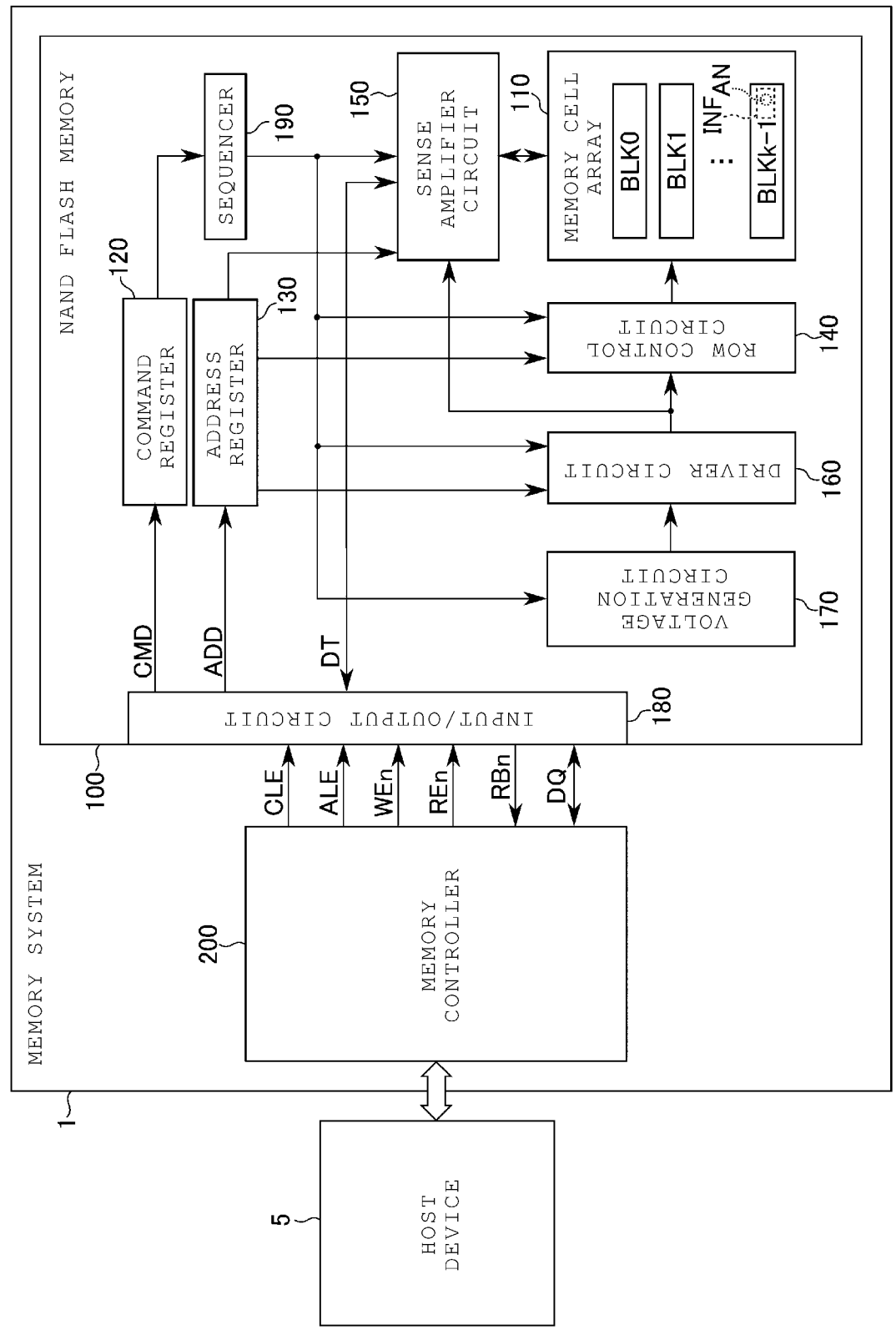
FIG. 1 is a block diagram illustrating a configuration example of a memory system according to an embodiment.

Embodiments provide a method of processing a memory system that can reduce environmental impacts and a memory system that enables such a method.

In general, according to an embodiment, a method of processing a memory system that includes a substrate with a connector and a semiconductor memory chip connected to the connector is provided. The method includes detaching the semiconductor memory chip from the connector, performing an annealing process with respect to the semiconductor memory chip detached from the connector, and after the annealing process, attaching the semiconductor memory chip to the connector on the substrate.

Hereinafter, one or more embodiments will be described in detail with reference to the drawings. In the following description, elements having the same function and configuration are denoted by the same reference numerals.

Further, in each of the following embodiments, when components (for example, circuits, wirings, various types of voltages and signals, or the like) having reference codes with last numbers/alphabets for distinguishing need not to be distinguished from each other, the description (reference codes) with the last numbers/alphabets omitted is used.

EMBODIMENT

A memory system according to an embodiment will be described with reference to FIGS. 1 to 12.

(1) Configuration Example

FIG. 1 is a block diagram illustrating a configuration example of a memory system 1 according to the embodiment.

As illustrated in FIG. 1, the memory system 1 according to the embodiment is connected to a host device 5 via a host bus. The memory system 1 according to the embodiment may be requested by the host device 5 to write data, read data, and erase data.

The host device 5 is, for example, a personal computer, a server, or the like. The host bus is, for example, a bus based on an interface standard such as an SD™ interface, a serial attached small computer system interface (SAS), a serial advanced technology attachment (SATA), a peripheral component interconnect express (PCIe), or a non-volatile memory express (NVMe). Moreover, the memory system 1 may be connected to the host device 5 by wireless communication.

The memory system 1 according to the embodiment includes a NAND flash memory 100 and a memory controller 200. For example, the memory system 1 is a solid state drive (SSD), a memory card, a USB memory, or the like.

The memory controller 200 is electrically coupled to the NAND flash memory 100. The memory controller 200 transmits a command CMD, address information ADD, and a plurality of control signals to the NAND flash memory 100.

The NAND flash memory 100 is an example of the memory device according to the embodiment. The NAND flash memory 100 is a non-volatile semiconductor memory device. For example, the NAND flash memory 100 is a set of a plurality of semiconductor chips.

The NAND flash memory 100 receives the command CMD, the address information ADD, and the plurality of control signals. Data DT is transferred between the NAND flash memory 100 and the memory controller 200. In the following, the data DT transferred from the memory controller 200 to the NAND flash memory 100 during a write sequence is referred to as a write data. The write data DT is written into the NAND flash memory 100. The data DT transferred from the NAND flash memory 100 to the memory controller 200 during the read sequence is referred to as a read data. The read data DT is read from the NAND flash memory 100.

The NAND flash memory 100 includes, for example, a memory cell array 110, a command register 120, an address register 130, a row control circuit 140, a sense amplifier circuit 150, a driver circuit 160, a voltage generation circuit 170, an input/output circuit 180, and a sequencer 190.

The memory cell array 110 stores data. A plurality of bit lines and a plurality of word lines are provided in the memory cell array 110. The memory cell array 110 includes a plurality of blocks BLK (BLK0, BLK1, . . . , BLKk−1). k is a natural number of 2 or more. A block BLK is a set of memory cells. Each memory cell is associated with one bit line and one word line. The memory cell array 110 includes a plurality of select gate lines for selecting a control unit in the memory cell array 110.

For example, a certain number of specific blocks BLK among the plurality of blocks store information INF such as setting information and management information for the operation of the NAND flash memory 100, information AN on a state/situation of the NAND flash memory 100, and the like. In the following, these information INF is also referred to as ROM information INF. The block BLK storing the ROM information INF is also referred to as a ROM block.

An internal configuration of the memory cell array 110 will be described below.

The command register 120 latches the command CMD from the memory controller 200. The command CMD is a signal including, for example, an instruction for causing the sequencer 190 to execute a read sequence, a write sequence, an erase sequence, or the like.

The address register 130 latches the address information (e.g., a select address) ADD from the memory controller 200. The address information ADD includes, for example, a block address, a page address (e.g., word line address), a column address, and the like. The block address, the page address, and the column address are used to select the block BLK, the word line, the select gate line, and the bit line, respectively. In the following, the block selected based on the block address is referred to as a selected block. The word line selected based on the page address is referred to as a selected word line.

The row control circuit 140 controls the operation of the memory cell array 110 with respect to the row of the memory cell array 110. The row control circuit 140 selects one block BLK in the memory cell array 110 based on the block address in the address register 130. The row control circuit 140 transfers, for example, a voltage applied to the wiring corresponding to the selected word line, to the selected word line in the selected block. The row control circuit 140 controls selection and non-selection of the select gate line based on the address information ADD. The row control circuit 140 includes a block decoder, a word line decoder, a select gate line decoder, a switch circuit, and the like.

The sense amplifier circuit 150 controls the operation of the memory cell array 110 with respect to the column of the memory cell array 110. In the write sequence, the sense amplifier circuit 150 applies a voltage to each of the bit lines provided in the memory cell array 110 according to the write data DT from the memory controller 200. In the read sequence, the sense amplifier circuit 150 determines the data stored in the memory cell based on the presence/absence of occurrence of the current or the fluctuation of the potential of the bit line. The sense amplifier circuit 150 transfers the data based on this determination result to the memory controller 200 as a read data DT. The sense amplifier circuit 150 includes a bit line selection circuit, an amplifier circuit, and the like.

The driver circuit 160 outputs a plurality of voltages used in the read sequence, the write sequence, the erase sequence, and the like to the memory cell array 110. The driver circuit 160 applies predetermined voltages to the wirings corresponding to the word line, the bit line, and the like based on the address information ADD in the address register 130.

The voltage generation circuit 170 generates the plurality of voltages for various types of operations of the NAND flash memory 100. The voltage generation circuit 170 outputs the generated voltages to the driver circuit 160.

The input/output circuit 180 functions as an interface circuit on the NAND flash memory 100 side between the NAND flash memory 100 and the memory controller 200. For example, the input/output circuit 180 communicates with the memory controller 200 based on a NAND interface standard such as an open NAND flash interface (ONFi). A command latch enable signal CLE, an address latch enable signal ALE, a write enable signal WEn, a read enable signal REn, a ready busy signal RBn, an input/output signal DQ, and the like are used for communication between the NAND flash memory 100 and the memory controller 200.

The command latch enable signal CLE is a signal indicating that the input/output signal DQ received by the NAND flash memory 100 is the command CMD. The address latch enable signal ALE is a signal indicating that the signal DQ received by the NAND flash memory 100 is the address information ADD. The write enable signal WEn is a signal instructing the NAND flash memory 100 to input the input/output signal DQ. The read enable signal REn is a signal instructing the NAND flash memory 100 to output the input/output signal DQ.

The ready busy signal RBn is a signal notifying, from the NAND flash memory 100, the memory controller 200 of whether the NAND flash memory 100 is in the ready state for accepting the instruction from the memory controller 200 or in the busy state for not accepting the instruction.

The input/output signal DQ is, for example, a signal set having an 8-bit width. The input/output signal DQ may include the command CMD, the address information ADD, the write/read data DT, and the like.

The sequencer 190 controls the operations of the entire NAND flash memory 100. For example, the sequencer 190 controls each circuit based on the command CMD in the command register 120.

<Memory Cell Array>

Figure 2:
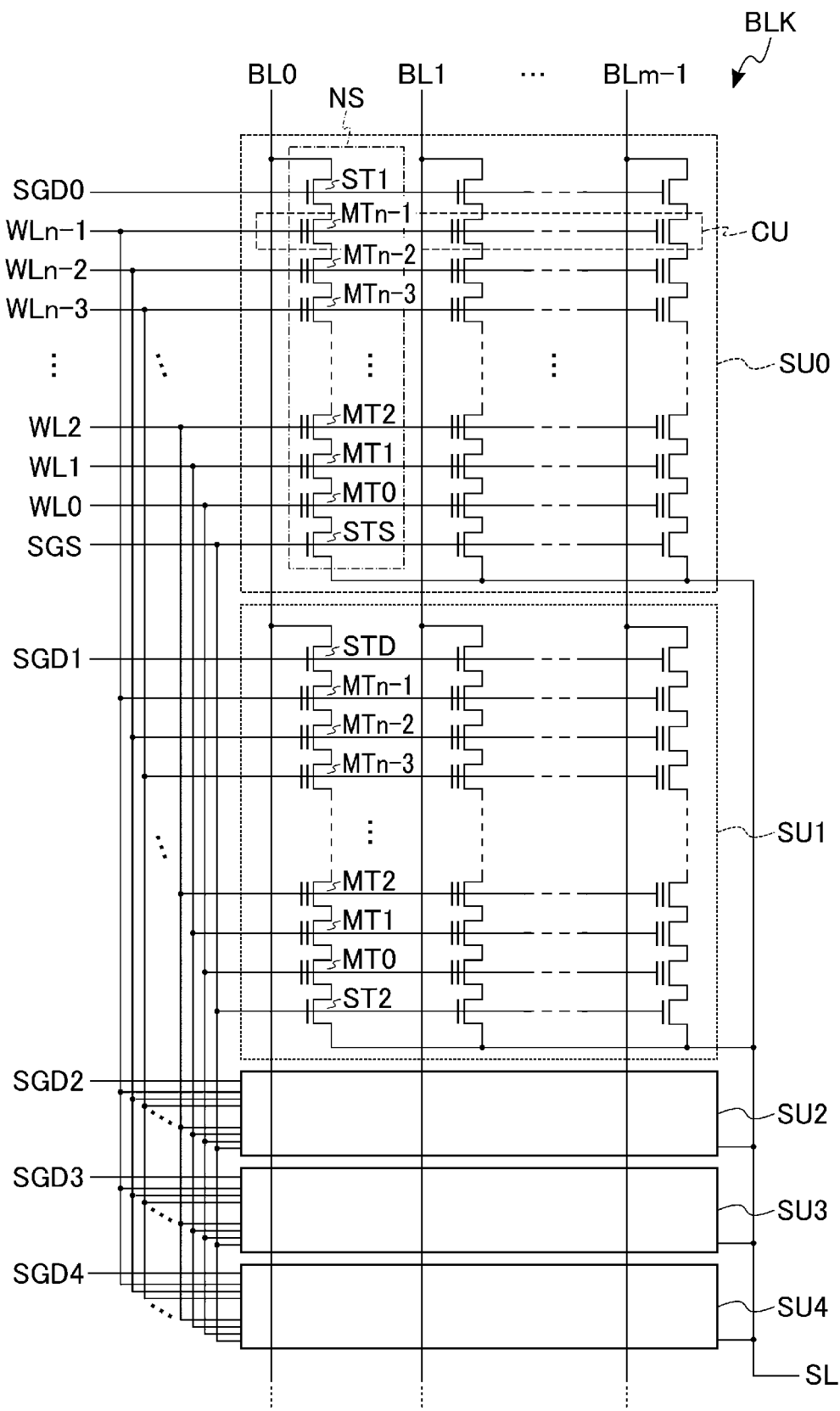
FIG. 2 is a circuit diagram illustrating a configuration example of a memory cell array of the memory system according to the embodiment.

FIG. 2 is a circuit diagram illustrating a circuit configuration of a certain block BLK in the memory cell array 110.

As illustrated in FIG. 2, one block BLK includes a plurality of (for example, five) string units SU (SU0 to SU4). Each string unit SU includes a plurality of NAND strings NS. The number of blocks BLK in the memory cell array 110, the number of string units SU in the block BLK, and the number of NAND strings NS in the string unit SU are freely selected.

Each of the NAND strings NS includes a plurality of memory cells MT (MT0 to MTn−1) and select transistors STD and STS. n is a natural number of 2 or more. The plurality of memory cells MT are connected in series between a source of the select transistor STD and a drain of the select transistor STS.

The memory cell MT latches data in a substantially non-volatile manner. The memory cell (also referred to as a memory cell transistor) MT is a field effect transistor having a control gate and a charge storage layer.

The gate of the select transistor STD in each of the string units SU0 to SU4 is connected to the corresponding one among a plurality of drain side select gate lines SGD0 to SGD4, respectively.

The gate of the select transistor STS in each of the string units SU0 to SU4 is commonly connected to, for example, a source side select gate line SGS. The gate of the select transistor STS may be connected to a different select gate line SGS for each of the string units SU0 to SU4.

The control gates of the memory cells MT0 to MTn−1 belonging to the same block BLK are respectively connected to one corresponding word line among the plurality of word lines WL (WL0 to WLn−1).

The drain of the select transistor STD of the NAND string NS belonging to the same column in the memory cell array 110 is connected to each of the corresponding bit lines among the plurality of bit lines BL (BL0 to BL (m−1)). m is a natural number of 2 or more.

The sources of the plurality of select transistors STS are commonly connected to a source line SL.

The string unit SU is an aggregate of NAND strings NS connected to different bit lines BL and connected to the same select gate line SGD. Hereinafter, in each string unit SU, a set of memory cells MT (or a memory cell group) commonly connected to the same word line WL is also referred to as a cell unit CU (or a memory group). The block BLK is an aggregate of the plurality of string units SU sharing the plurality of word lines WL. The memory cell array 110 is an aggregate of the plurality of blocks BLK sharing the plurality of bit lines BL.

Figure 3:
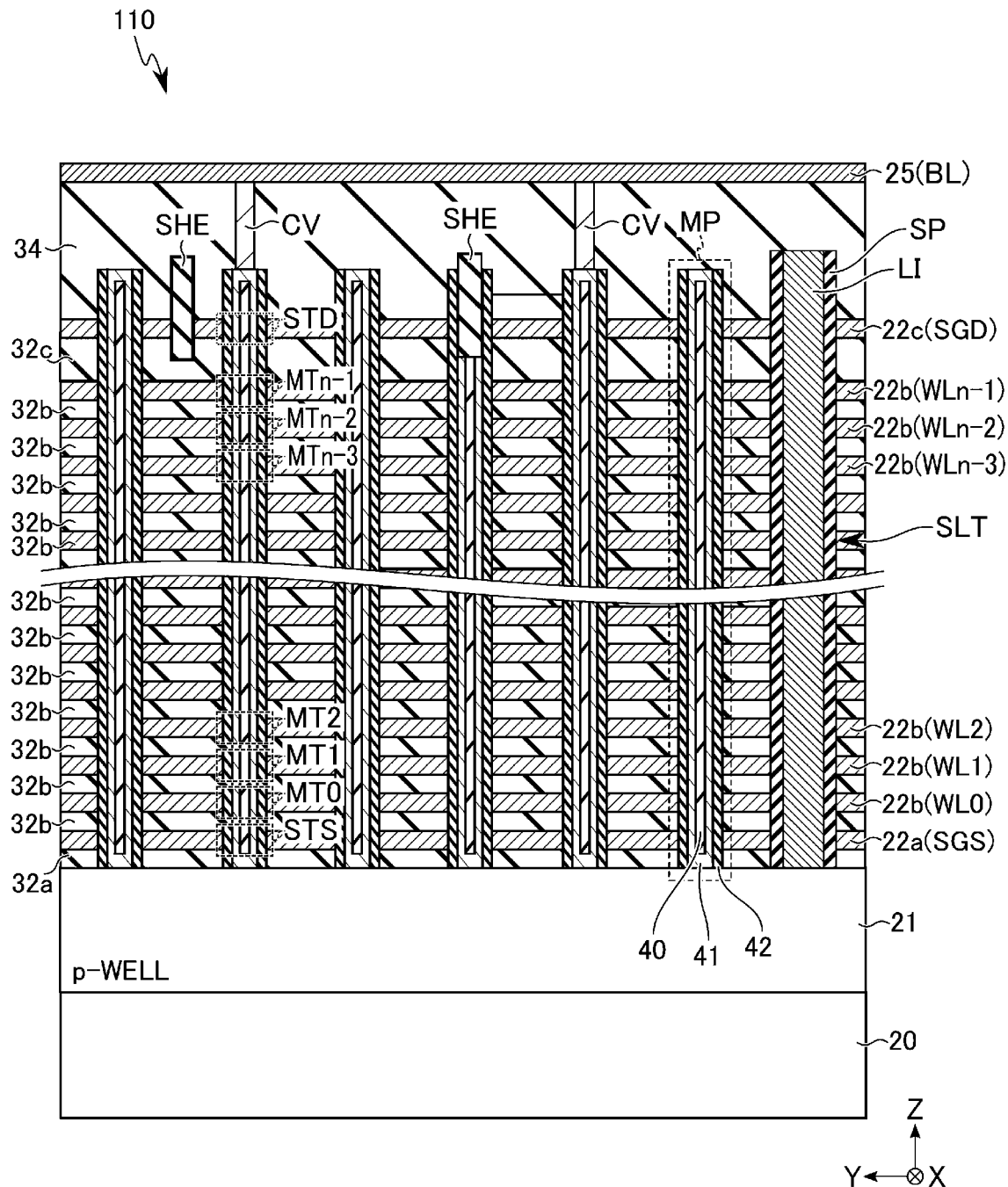
FIG. 3 is a cross-sectional diagram illustrating a configuration example of a part of the memory cell array.

FIG. 3 is a cross-sectional diagram illustrating a portion of the block BLK.

In FIG. 3, X direction corresponds to the stretching direction of the word line WL, Y direction corresponds to the stretching direction of the bit line BL, and Z direction corresponds to the direction perpendicular to the surface of the substrate (for example, the semiconductor substrate) 20 used for the NAND flash memory 100.

As illustrated in FIG. 3, the memory cell array 110 has a structure (e.g., stacked wiring) in which a plurality of conductive layers 22 (22a, 22b, and 22c) and a plurality of insulating layers 32 (32a, 32b, and 32c) are stacked in the Z direction.

A p-type well region 21 is provided in the semiconductor layer of the semiconductor substrate 20.

An insulating layer 32a is provided on the upper surface of the p-type well region 21. A conductive layer 22a is provided on the upper surface of the insulating layer 32a. The conductive layer 22a is, for example, a plate-shaped layer extending along an X-Y plane configured with the X direction and the Y direction. The conductive layer 22a is used as the select gate line SGS. The conductive layer 22a contains, for example, tungsten.

The plurality of insulating layers 32b and the plurality of conductive layers 22b are alternately stacked in the Z direction on the upper surface of the conductive layer 22a. The conductive layer 22b is, for example, a plate-shaped layer extending along the X-Y plane. The plurality of stacked conductive layers 22b are used as word lines WL0 to WLn−1, respectively, in order from the semiconductor substrate 20 side. The conductive layer 22b contains, for example, tungsten.

The conductive layer 22c is provided above the uppermost conductive layer 22b via the insulating layer 32c. The conductive layer 22c is, for example, a plate-shaped layer extending along the X-Y plane. The conductive layer 22c is used as the select gate line SGD. The conductive layer 22c contains, for example, tungsten.

An insulating layer 34 is provided on the upper surface of the conductive layer 22c. The insulating layer 34 may be configured with the plurality of insulating layers. A conductive layer 25 is provided on the upper surface of the insulating layer 34. The conductive layer 25 is, for example, a line-shaped layer extending in the Y direction. The conductive layer 25 is used as a bit line BL. The plurality of conductive layers 25 are located along the X direction in a region (not illustrated). The conductive layer 25 contains, for example, copper.

Each of memory pillars MP extends along the Z direction and is provided in the stacked wiring. The memory pillar MP penetrates the insulating layer 32 and the conductive layer 22. The bottom of the memory pillar MP is in contact with the p-type well region 21. The side surface of the memory pillar MP faces the conductive layer 22. The portion where the memory pillar MP and the conductive layer 22a intersect functions as a select transistor STS. The portion where the memory pillar MP and one conductive layer 22b intersect functions as one memory cell MT. The portion where the memory pillar MP and the conductive layer 22c intersect functions as a select transistor STD.

Each of the memory pillars MP includes, for example, a core member 40, a semiconductor layer 41, and a stacked film 42. The core member 40 extends along the Z direction. For example, the upper end of the core member 40 is located above the conductive layer 22c. The semiconductor layer 41 is provided between the lower end of the core member 40 and the p-type well region 21. The semiconductor layer 41 covers a periphery of the core member 40. A portion of the semiconductor layer 41 is in contact with the p-type well region 21 at the bottom of the memory pillar MP. The stacked film 42 covers the side surface of the semiconductor layer 41.

The core member 40 contains an insulator such as silicon oxide. The semiconductor layer 41 contains, for example, silicon.

A contact CV is provided on the upper surface of the semiconductor layer 41 in the memory pillar MP. In the illustrated region, two contacts CV corresponding to the two memory pillars MP among the six memory pillars MP are displayed. Among the plurality of memory pillars MP illustrated in FIG. 3, the memory pillars MP that do not overlap a slit SHE and are not connected to the contact CV are connected to the contact CV in the region (for example, the region in the depth direction or the front direction of the paper surface) not illustrated.

One conductive layer 25 (that is, one bit line BL) is in contact with the upper surface of the contact CV.

A slit SLT has a portion provided along, for example, the X-Z plane and divides the plurality of conductive layers 22. A contact LI is provided along the slit SLT. A portion of the upper end of the contact LI is in contact with the insulating layer 34. The lower end of the contact LI is in contact with the p-type well region 21. The contact LI is used, for example, as a portion of the source line SL. A spacer SP is provided at least between the contact LI and the conductive layer 22. The contact LI is separated and insulated from the conductive layer 22 by the spacer SP.

The slit SHE has, for example, a portion provided along the X-Z plane and divides at least the conductive layer 22c. The upper end of the slit SHE is in contact with the insulating layer 34. The lower end of the slit SHE is in contact with the insulating layer 32c between the conductive layer 22b and the uppermost conductive layer 22c. The slit SHE contains an insulator such as silicon oxide.

A plurality of the above-described structures are provided in a depth direction (or the front direction) of the paper surface of FIG. 3. The string unit SU is configured with a set of the plurality of NAND strings NS provided in the depth direction.

It is noted that the structure of the memory cell array 110 is not limited to the above-described example and may have other structures. For example, the memory cell array 110 may be provided above the semiconductor substrate 20 via the insulating layer. In this case, elements (for example, a field effect transistor) including the row control circuit 140 or the like may be provided on the semiconductor substrate 20 below the memory cell array 110.

Figure 4:
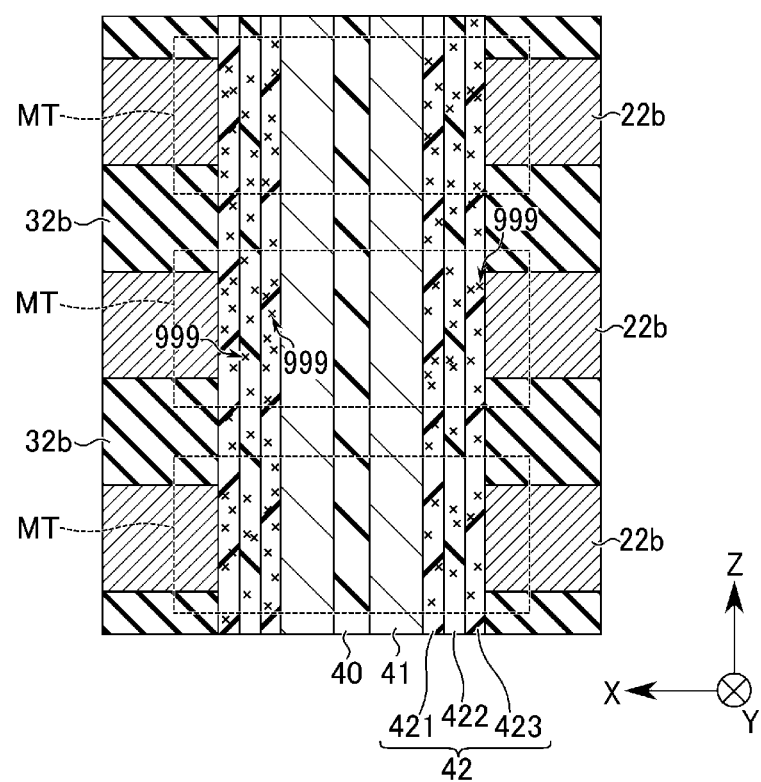
FIG. 4 is a cross-sectional diagram illustrating a configuration example of a part of the memory cell array.

FIG. 4 is a cross-sectional diagram illustrating the structure of the memory cell MT more specifically.

As illustrated in FIG. 4, the stacked film 42 includes a gate insulating film 421, a charge storage layer 422, and a block insulating film 423.

The semiconductor layer 41 functions as a current path for the NAND string NS. The semiconductor layer 41 is a region (hereinafter referred to as a channel region) in which the channels of the memory cell MT and the select transistors STD and STS are formed. The channel region of the memory cell MT faces the conductive layer 22 in the direction parallel to the surface of the semiconductor substrate 20.

The gate insulating film 421 surrounds the side surface of the semiconductor layer 41. The charge storage layer 422 surrounds the side surface of the gate insulating film 421. The block insulating film 423 surrounds the side surface of the charge storage layer 422. The charge storage layer 422 is provided between the gate insulating film 421 and the block insulating film 423.

The gate insulating film 421 functions as a tunnel barrier between the semiconductor layer 41 and the charge storage layer 422. The gate insulating film 421 contains, for example, silicon oxide.

The charge storage layer 422 can store charges injected into the charge storage layer 422 from the semiconductor layer 41 via the gate insulating film 421. The charge storage layer 422 contains, for example, silicon nitride. Moreover, the charge storage layer 422 may contain silicon.

The block insulating film 423 hinders transfer of charges between the charge storage layer 422 and the conductive layer 22. The block insulating film 423 contains, for example, silicon oxide or aluminum oxide.

In the NAND flash memory 100, when the memory cells MT0 to MTn−1 and the select transistors STD and STS are turned on, the current flows between the bit line BL and the contact LI (source line SL) via the memory pillar MP.

One memory cell MT can store one or more bits of data by associating a threshold voltage of the memory cell MT with a value of data to be stored. The memory cell MT storing a 1-bit data is referred to as SLC (single-level cell). The memory cell MT storing a 2-bit data is referred to as MLC (multi-level cell). The memory cell MT storing a 3-bit data is referred to as TLC (triple-level cell). The memory cell MT storing a 4-bit data is referred to as QLC (quad-level cell).

Figure 5:
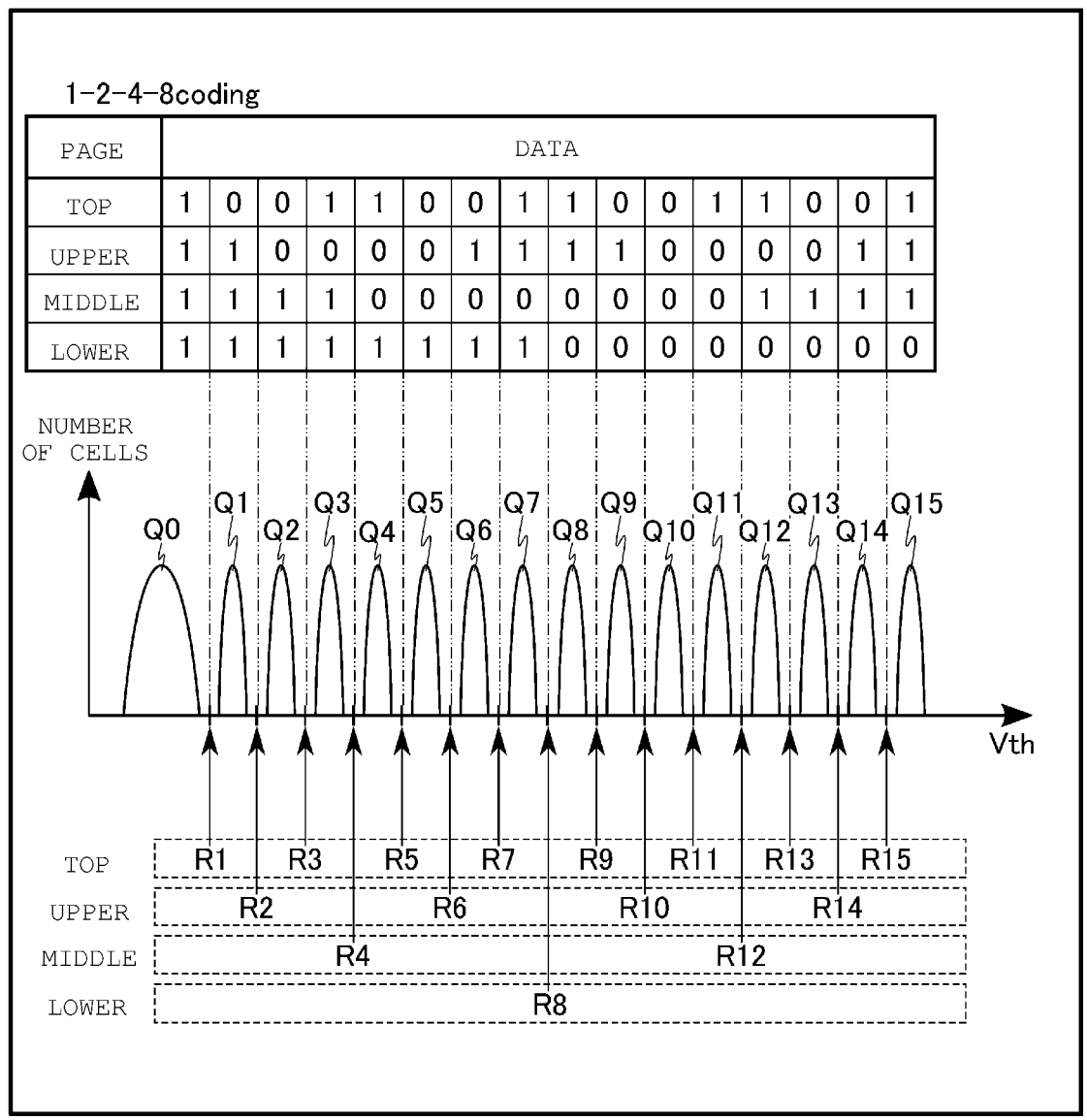
FIG. 5 is a diagram illustrating a relationship between a threshold voltage of a memory cell and data.

FIG. 5 is a diagram illustrating an example of a relationship between the threshold voltage of the memory cell MT and the data. The horizontal axis of the graph in FIG. 5 represents a threshold voltage (voltage value) of the memory cell MT. The vertical axis of the graph of FIG. 5 represents the number of memory cells.

FIG. 5 illustrates an example when the memory cell is QLC (quad-level cell).

As illustrated in FIG. 5, when each memory cell MT stores a 4-bit data, a threshold voltage distribution of the memory cell MT has 16 types of states. In the embodiment, these 16 types of states are referred to as states "Q0", "Q1", "Q2", "Q3", "Q4", "Q5", "Q6", "Q7", "Q8", "Q9", "Q10", "Q11", "Q12", "Q13", "Q14", and "Q15" in order from the lowest threshold voltage. 4-bit data different from each other is assigned to each of the states "Q0" to "Q15".

In the following, an example of data assignment to each of the states "Q0" to "Q15" is illustrated. Herein, a 4-bit data is illustrated for each state, in an array of "Top Bit/Upper Bit/Middle Bit/Lower Bit".

State "Q0": "1111" data
State "Q1": "0111" data
State "Q2": "0011" data
State "Q3": "1011" data
State "Q4": "1001" data
State "Q5": "0001" data
State "Q6": "0101" data
State "Q7": "1101" data
State "Q8": "1100" data
State "Q9": "0100" data
State "Q10": "0000" data
State "Q11": "1000" data
State "Q12": "1010" data
State "Q13": "0010" data
State "Q14": "0110" data
State "Q15": "1110" data In this manner, a data having a specific data pattern (bit array) is associated with each of the states of the plurality of threshold voltage distributions.

A read voltage is set for each of the adjacent states. Specifically, a read voltage R1 is set between the states "Q0" and "Q1". A read voltage R2 is set between the states "Q1" and "Q2". A read voltage R3 is set between the states "Q2" and "Q3". A read voltage R4 is set between the states "Q3" and "Q4". A read voltage R5 is set between the states "Q4" and "Q5". A read voltage R6 is set between the states "Q5" and "Q6". A read voltage R7 is set between the states "Q6" and "Q7". A read voltage R8 is set between the states "Q7" and "Q8". A read voltage R9 is set between the states "Q8" and "Q9". A read voltage R10 is set between the states "Q9" and "Q10". A read voltage R11 is set between the states "Q10" and "Q11". A read voltage R12 is set between the states "Q11" and "Q12". A read voltage R13 is set between the states "Q12" and "Q13". A read voltage R14 is set between the states "Q13" and "Q14". A read voltage R15 is set between the states "Q14" and "Q15".

When the threshold voltage of the memory cell MT is higher than the applied read voltage, the memory cell MT is turned off. When the threshold voltage of the memory cell MT is equal to or lower than the applied read voltage, the memory cell MT is turned on. In this manner, a magnitude relationship of the threshold voltage of the memory cell with respect to the applied read voltage can be determined by on/off of the memory cell MT in response to the application of the read voltage.

The one-page data (i.e., lower page data) configured with the lower bits is determined by one time of determination of the threshold voltage (e.g., determination of on/off of the memory cell) using the read voltage R8. That is, the lower page data is determined by the one read voltage from the read voltage R1 to the read voltage R15. The number of times of application of the read voltage in reading the lower page data is one.

The one-page data (i.e., middle page data) configured with the middle bits is determined by two times of the determination of the threshold voltage using the two read voltages R4 and R12. That is, the middle page data is determined by the two read voltages among the read voltage R1 to the read voltage R15. The number of times of application of the read voltage in reading the middle page data is two.

The one-page data (i.e., upper page data) configured with the upper bits is determined by four times of the determination of the threshold voltage using the four read voltages R2, R6, R10, and R14. That is, the upper page data is determined by the four read voltages among the read voltage R1 to the read voltage R15. The number of times of application of the read voltage in reading the upper page data is four.

The one-page data (i.e., top page data) configured with the top bits is determined by eight times of the determination of the threshold voltage using the eight read voltages R1, R3, R5, R7, R9, R11, R13, and R15. That is, the top page data is determined by the eight read voltages among the read voltage R1 to the read voltage R15. The number of times of application of the read voltage in reading the top page data is eight.

Hereinafter, the operation of reading the lower page data is referred to as "lower reading". The operation of reading the middle page data is referred to as "medium reading". The operation of reading the upper page data is referred to as "upper reading". The operation of reading the top page data is referred to as "top reading".

In the data assignment described above, the number of times of application of the read voltage in the lower/middle/upper/top reading is one time/two times/four times/eight times, respectively, and thus, is referred to as, for example, "1-2-4-8" coding.

When the memory cell MT stores a 4-bit data, the data assignment is different. Further, each memory cell MT may store a data of 5 bits or more.

It is noted that the structure of the memory cell MT is not limited to the structure illustrated in FIG. 4. For example, the memory cell MT may be a memory cell having a stack gate structure having a floating gate electrode.

In the operation sequence of the NAND flash memory 100, a cycle where the write sequence for a select address is executed after the erase sequence for the block BLK including the select address of a data write target is treated as one cycle (hereinafter, referred to as a P/E cycle). In the erase sequence, an erase voltage having a relatively large voltage value is applied to the memory cell MT in order to erase the charges in the memory cell MT. In the write sequence, a program voltage having a relatively large voltage value is applied to the memory cell MT to inject charges into the memory cell MT.

As schematically illustrated in FIG. 4, in the memory cell MT of the NAND flash memory 100, when the data writing and the data erasing for the memory cell MT are repeatedly executed, defects 999 may be formed in the memory cell MT due to the stress caused by the large voltage applied to the memory cell MT. For example, the defects 999 are formed in the gate insulating film 421, in the charge storage layer 422, in the block insulating film 423, and the like. These defects 999 cause a deterioration of characteristics of the memory cell MT. As the number of P/E cycles increases, the deterioration of the characteristics of the memory cell MT becomes remarkable.

The defects 999 in the memory cell MT can be removed by an annealing process (which is a heating treatment) under a certain condition. As the result, the characteristics of the memory cell MT can be restored.

In the embodiment, the deterioration of the memory cell MT is recovered by the following configuration and processing.

Therefore, according to the embodiment, the NAND flash memory 100 once determined to be unusable is reused.

(2) Configuration and Processing for Recovery Process (2-1) Module Structure

The module structure of the memory system 1 according to the embodiment will be described with reference to FIGS. 6 to 8.

Figure 6:
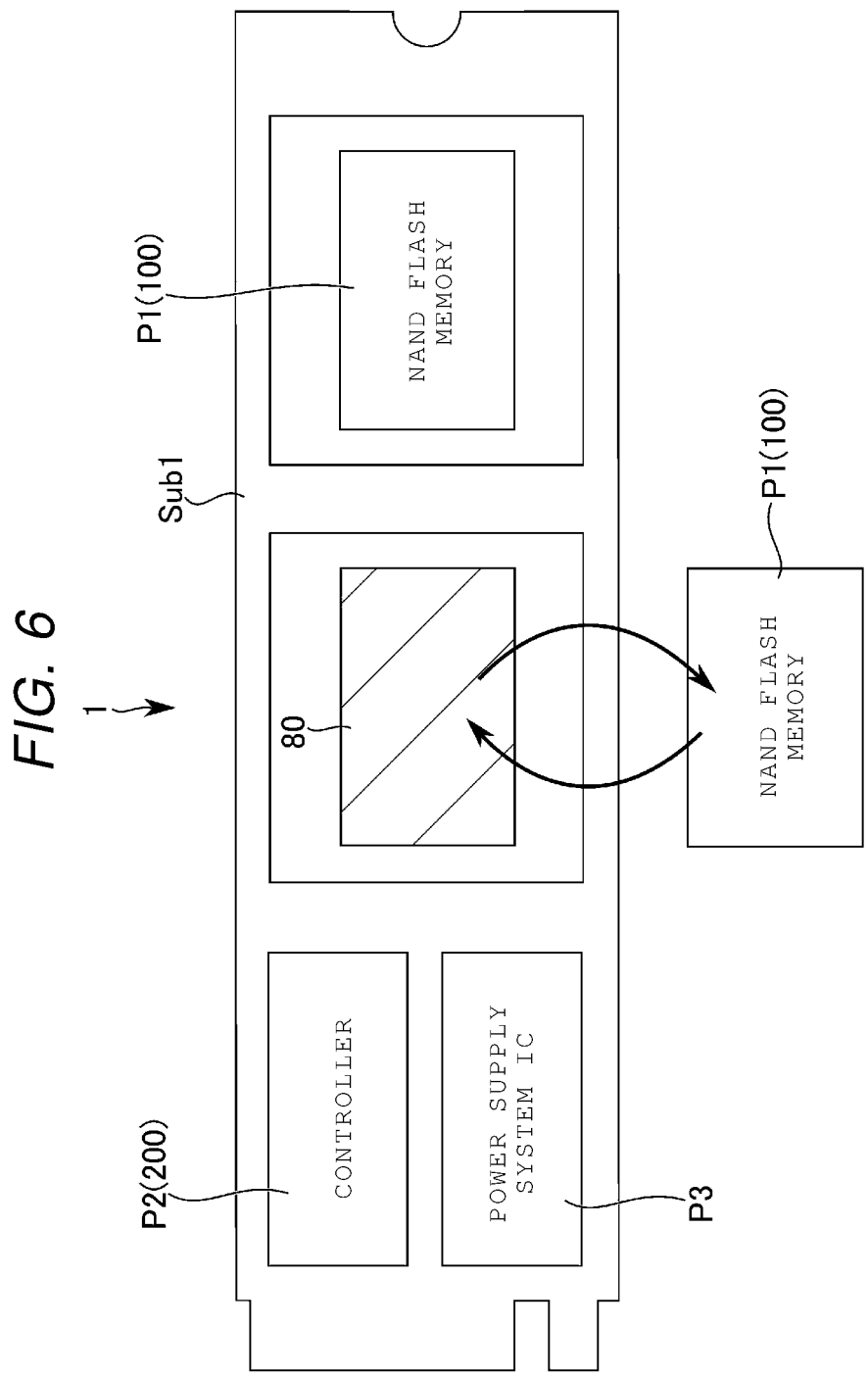
FIG. 6 is a diagram illustrating a configuration example of the memory system according to the embodiment.

FIG. 6 is a schematic diagram illustrating an example of the module structure of the memory system 1 according to the embodiment.

As illustrated in FIG. 6, the memory system 1 according to the embodiment includes a plurality of package devices P1, P2, and P3. The plurality of package devices P1, P2, and P3 are provided on a module substrate Sub1.

The package device P1 is a semiconductor package of the NAND flash memory 100. Hereinafter, the package device P1 is also referred to as a memory package P1. For example, the memory package P1 includes the plurality of semiconductor chips (not illustrated) including the NAND flash memory 100 on a package substrate (not illustrated) having a certain structure.

The package device P2 is a semiconductor package of the memory controller 200. Hereinafter, the package device P2 is also referred to as a controller package P2.

The package device P3 is, for example, a semiconductor package of the power supply system IC. Hereinafter, the package device P3 is also referred to as a power supply system IC package P3. The power supply system IC package P3 supplies various types of voltages to the memory package P1 and the controller package P2. For example, the power supply system IC package includes a regulator circuit, a DC-AC conversion circuit, a protection circuit, and the like.

The memory package P1 is electrically connected to the controller package P2, the power supply system IC package P3, the electronic component (not illustrated), and the like via wiring (not illustrated) provided on the surface of the module substrate Sub1 or in the module substrate Sub1.

In the embodiment, the memory package P1 of the NAND flash memory 100 is configured to be detachable from the module substrate Sub1. The memory package P1 is connected to the module substrate Sub1 via the connector 80 on the module substrate Sub1.

Figure 7:
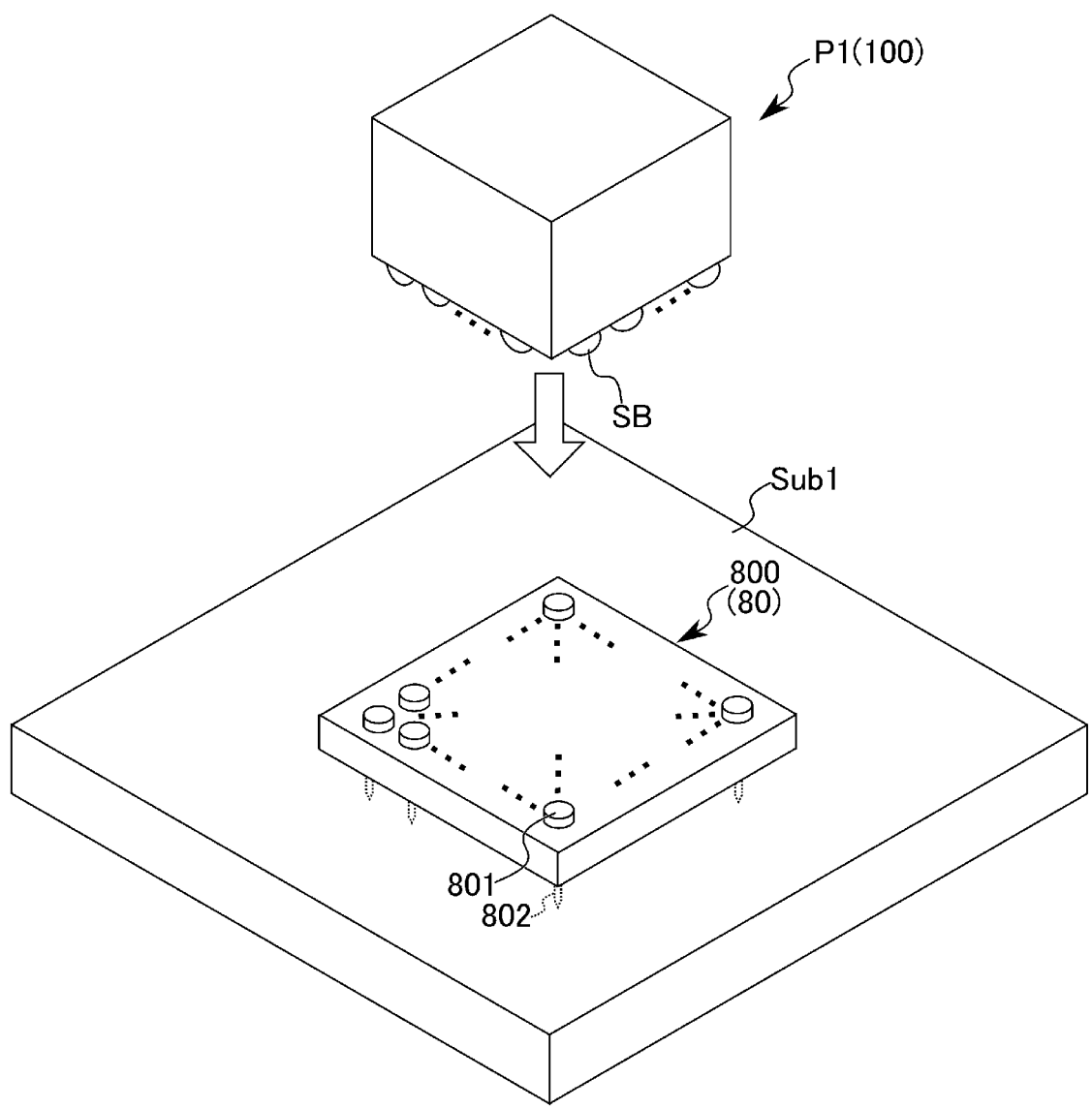
FIG. 7 is a diagram illustrating a configuration example of the memory system according to the embodiment.

FIG. 7 is a schematic bird's-eye diagram illustrating a configuration example of the memory package P1 and the connector 80 in the memory system 1 according to the embodiment.

For example, the memory package P1 has a ball grid array (BGA) structure. The memory package P1 has a plurality of terminals (for example, solder balls) SB at the bottom of the package substrate (not illustrated).

It is noted that the memory package P1 may have a package structure other than the BGA structure such as a pin grid array (PGA) structure as long as the memory package can be detachable from the module substrate Sub1.

In the module substrate Sub1, the socket 800 is provided as the connector 80. The socket 800 has a plurality of connection portions 801 and a plurality of terminals 802.

Each connection portion 801 is provided on the upper surface side of the socket 800. The terminal 802 is provided on the lower surface side of the socket 800. Each terminal 802 is electrically connected to the corresponding one among the plurality of connection portions 801 via the wiring in the socket 800. Each connection portion 801 is connected to the wiring or terminal of the module substrate Sub1 via the corresponding terminal 802. For example, the terminal 802 is a pin or a lead portion.

Each of the plurality of terminals SB of the memory package P1 is connected to the corresponding one among the plurality of connection portions 801.

The memory package P1 is fixed to the socket 800 when connected to the socket 800, for example, by a fixing portion (not illustrated) such as a top cover or a plate.

Accordingly, the memory package P1 is loaded (mounted) on the module substrate Sub1 so as to be detachable from the module substrate Sub1 by the socket 800.

At the time of shipment and use of the memory system 1, the memory package P1 is connected to the socket 800 of the module substrate Sub1.

During the recovery process for the NAND flash memory 100, the memory package P1 is detached from the socket 800 of the module substrate Sub1. The annealing process for the recovery process is performed on the detached memory package P1.

The memory package P1 after the annealing process is reconnected to the socket 800.

Accordingly, the memory package P1 is selectively annealed among the plurality of package devices P1, P2, and P3 in the memory system 1. The package devices P1, P2, and P3 other than the memory package P1 to be annealed in the memory system 1 are avoided from being exposed to a high temperature condition of the annealing process.

Figure 8:
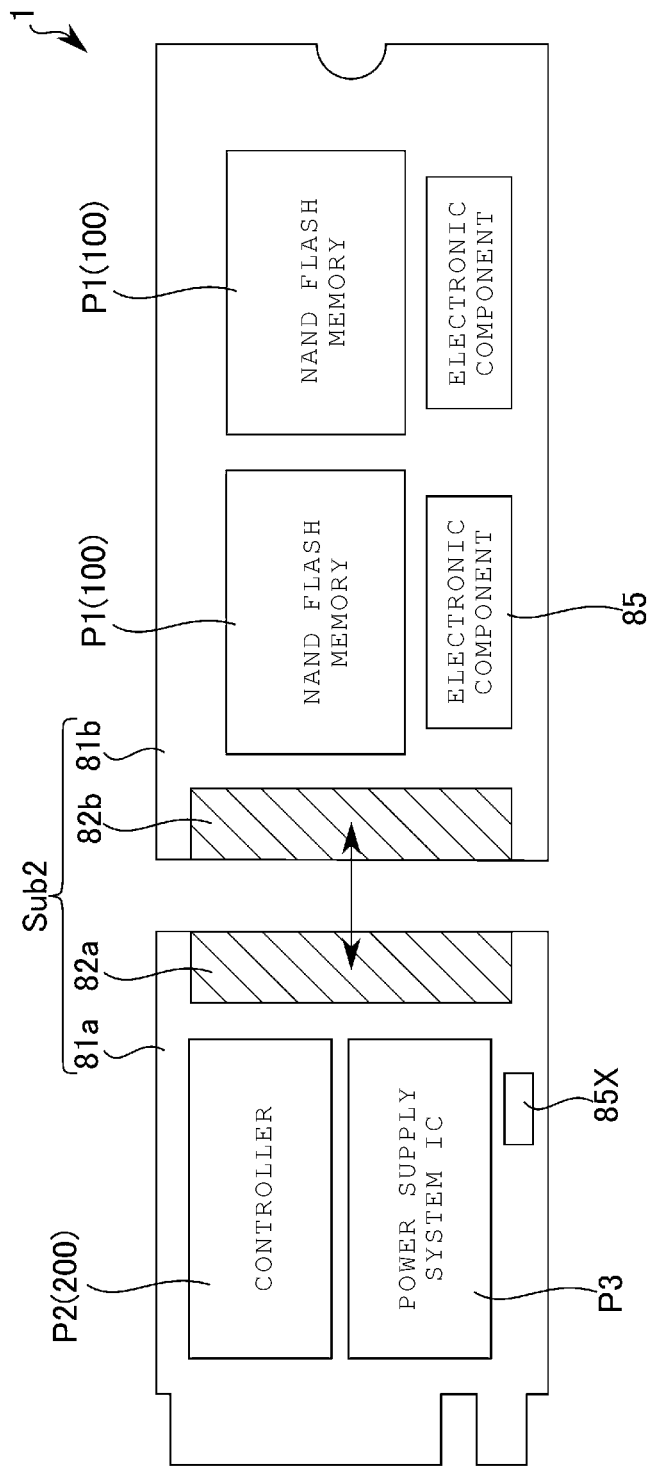
FIG. 8 is a diagram illustrating a configuration example of the memory system according to the embodiment.

FIG. 8 illustrates an example of a module structure having a configuration different from that of FIG. 6.

The module substrate Sub2 may have a plurality of separable portions 81a and 81b. Herein, the portions 81a and 81b are referred to as substrate portions 81a and 81b.

Each of the substrate portions 81a and 81b has connectors 82a and 82b. The plurality of substrate portions 81a and 81b are electrically connected to each other via the connectors 82a and 82b. The signal and voltage are transferred between the substrate portion 81a and the substrate portion 81b via the connectors 82a and 82b. Accordingly, the NAND flash memory 100 can communicate with the memory controller 200 via the connectors 82a and 82b. Further, the power supply system IC package P3 supplies various types of voltages (for example, a power supply voltage and a ground voltage) to the NAND flash memory 100 via the connectors 82a and 82b.

For example, the controller package P2 and the power supply system IC package P3 are provided on the substrate portion 81a of the module substrate Sub2.

The memory package P1 is provided on the substrate portion 81b of the module substrate Sub2.

The memory system 1 includes a plurality of electronic components 85 and 85X such as a capacitor in addition to the memory package P1 and the controller package P2.

For example, among the plurality of electronic components, the electronic component 85 desirable to be provided in the vicinity of the memory package P1 is provided on the substrate portion 81b of the module substrate Sub2. It is desirable that the electronic component 85 provided on the substrate portion 81b has heat resistance with which the electronic component can withstand the annealing process. The heat resistance of the electronic component 85 is higher than the heat resistance of the controller package P2 (memory controller 200) and/or the heat resistance of the power supply system IC package (power supply system IC) P3. In a specific implementation, the heat resistance of a component corresponds to an upper limit of an operating temperature range of the component, which may be shown in a specification of the component.

For example, the electronic component 85X is provided on the substrate portion 81a. The function (type) of the electronic component 85X is the same as the function (type) of the electronic component 85. The heat resistance of the electronic component 85 is higher than the heat resistance of the electronic component 85X.

When the memory system 1 is used, the substrate portion 81b is connected to the substrate portion 81a via the connectors 82a and 82b.

When the recovery process of the NAND flash memory 100 is executed on the memory package P1, the substrate portion 81b is separated from the substrate portion 81a.

The annealing process for the recovery process is performed on the entire substrate portion 81b in a state where the package device P1 is mounted.

As described above, since the portion 81b provided with the memory package P1 has a configuration so as to be detachable from the module substrate Sub2, devices other than the memory package P1 such as a controller package P2 can be avoided relatively easily from being exposed to the high temperature condition during the annealing process.

(2-2) Recovery process Device

A recovery process device for the memory system 1 according to the embodiment will be described with reference to FIG. 9.

Figure 9:
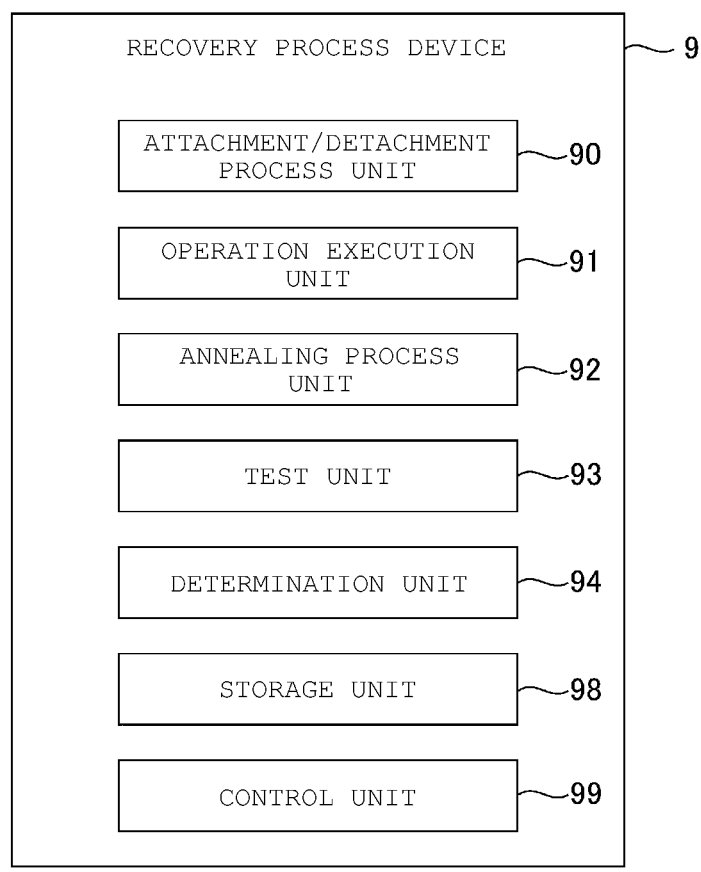
FIG. 9 is a diagram illustrating a device for processing the memory system according to the embodiment.

FIG. 9 is a diagram illustrating a configuration example of a recovery process device 9 for executing a recovery process on the NAND flash memory 100.

The recovery process device 9 of FIG. 9 executes various types of operations, processes, and controls for the recovery process on the NAND flash memory 100.

For example, the recovery process device 9 includes an attachment/detachment process unit 90, an operation execution unit 91, an annealing process unit 92, a test unit 93, a determination unit 94, a storage unit 98, a control unit 99, and the like.

The attachment/detachment process unit 90 detaches the NAND flash memory 100 (e.g., memory package P1) from the module substrate Sub (Sub1, Sub2). The attachment/detachment process unit 90 attaches the memory package P1 to the module substrate Sub. The attachment/detachment process unit 90 includes a stage (not illustrated) for holding the NAND flash memory 100 in the recovery process device 9. The attachment/detachment process unit 90 has, for example, the mechanical unit (for example, the manipulator and the end effector) for attaching/detaching the memory package P1.

The operation execution unit 91 executes various types of operations of the NAND flash memory 100 such as a write sequence, an erase sequence, and a read sequence on the NAND flash memory 100 stored in the recovery process device 9.

The operation execution unit 91 reads various types of information and data from the NAND flash memory 100 by the read sequence and stores the read information in the storage unit 98. The operation execution unit 91 erases the data in the NAND flash memory 100 by the erase sequence. The operation execution unit 91 writes the information and data in the storage unit 98 to the NAND flash memory 100 by the write sequence.

For example, the operation execution unit 91 reads the ROM information INF from the ROM block BLK. In the embodiment, the ROM information INF includes information AN related to the annealing process of the NAND flash memory 100 in addition to the setting information and the management information. In the following, the information AN related to the annealing process is referred to as annealing process information AN.

Annealing process information AN includes history information related to the annealing process of the NAND flash memory 100 that is a processing target. The annealing process information AN includes the number of times of annealing processes that have been performed in the past on the NAND flash memory 100 that is a processing target. The annealing process information AN may include information on the temperature and time of the annealing process. In the following, the number of times of annealing processes performed is also referred to as the cumulative number of annealing.

The setting information includes parameters used for operating the chip of the NAND flash memory 100 and the like. For example, the setting information includes the voltage values and the plurality of parameters relating to various types of controls used in each operation sequence, such as program voltage parameters, read voltage parameters, and erase voltage parameters. The management information includes, for example, a defective word line address, a defective block address, redundancy information, and the like. The setting information and the management information are written to one or more ROM blocks BLK of each chip of the NAND flash memory 100 during the wafer die sorting.

The annealing process unit 92 executes an annealing process under a desired condition on the NAND flash memory 100. For example, the temperature of the annealing process is set to any applicable temperature in a range of 120° C. to 280° C. For example, the time period of the annealing process is set to any applicable time period in a range of 1 hour to 3 days (72 hours). Moreover, the temperature and time of the annealing process are not limited to the above-described values, and may be appropriately changed depending on the type and characteristics of the NAND flash memory 100 and the materials including the NAND flash memory 100.

The test unit 93 can execute various types of test processes on the NAND flash memory 100. For example, the test unit 93 can obtain a size of the distribution of the threshold voltages of the plurality of memory cells MT based on the writing result and the reading result of a certain data for the plurality of memory cells MT as a test result.

The determination unit 94 executes various types of determination processes related to the recovery process of the NAND flash memory 100. For example, the determination unit 94 determines whether the annealing process is executed.

The storage unit 98 stores the ROM information and data read from the NAND flash memory 100. The storage unit 98 can store various types of information on the recovery process and various types of information used for each of the units 90, 91, 92, 93, 94, and 99 in the recovery process device 9. For example, the storage unit 98 can store a program for recovery process of the NAND flash memory 100.

The control unit 99 controls the operation and process of each of the units 90, 91, 92, 93, and 94 of the recovery process device 9. For example, the control unit 99 performs various types of controls by using the information, data, and programs in the storage unit 98.

Each of the above-mentioned units 90, 91, 92, 93, 94, 98, and 99 of the recovery process device 9 is implemented by software (e.g., program), hardware (e.g., circuit and mechanism), and the combination of software and hardware, respectively.

(3) Processing Example

A processing example of the memory system 1 according to the embodiment will be described with reference to FIGS. 10 and 11.

Figure 10:
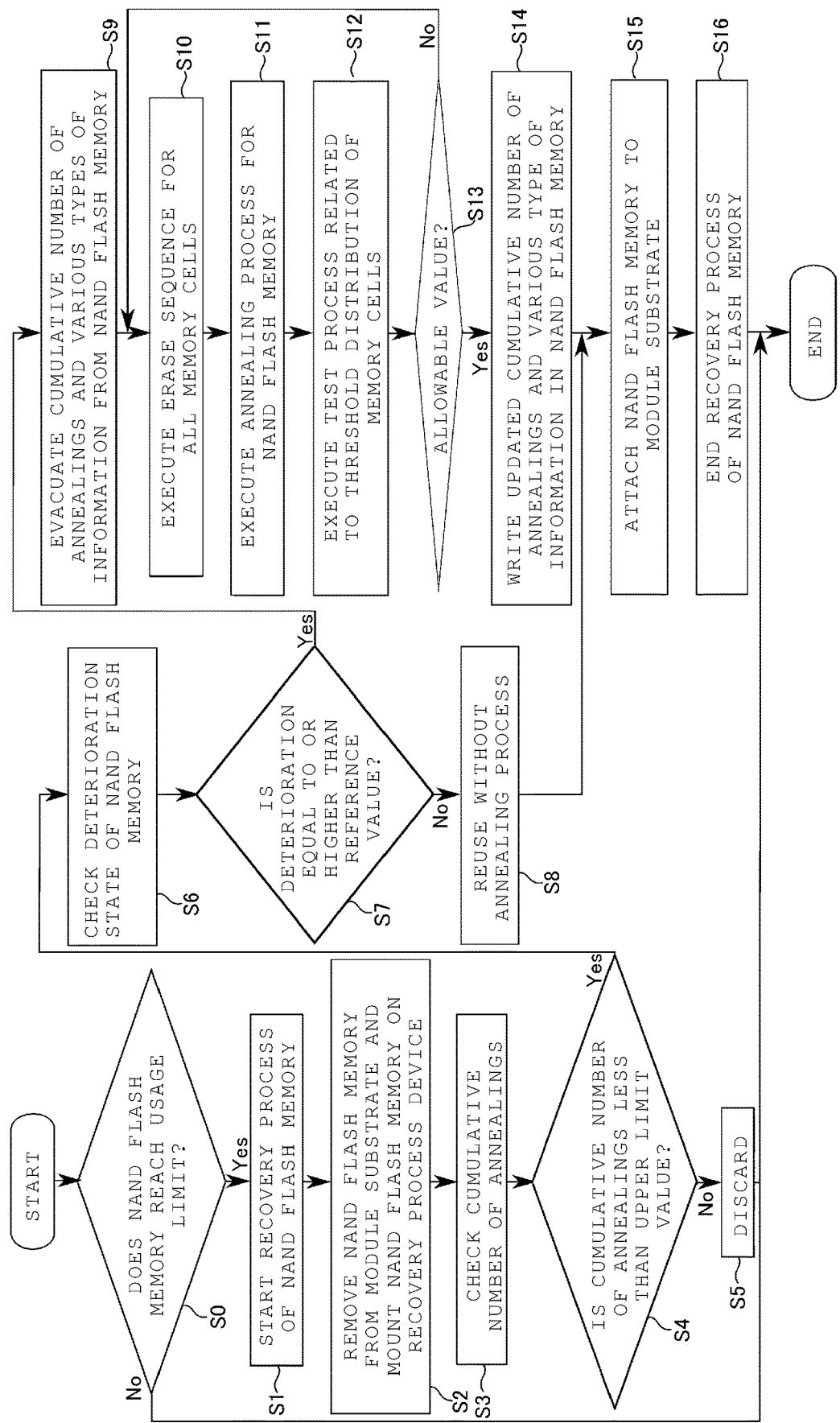
FIG. 10 is a flowchart illustrating a method for processing the memory system according to the embodiment.

FIG. 10 is a flowchart illustrating an example of the recovery process of the memory system 1 according to the embodiment.

<S0>

In the memory system 1 according to the embodiment, the memory controller 200 (or the host device 5) determines whether the NAND flash memory 100 reaches a usage limit.

For example, the memory controller 200 determines whether the usage limit of the NAND flash memory 100 is reached based on the information on a usage situation of the memory system 1 such as a total amount of write data of the NAND flash memory 100.

When the NAND flash memory 100 does not reach the usage limit (No in S0), the processing flow ends.

<S1>

When the NAND flash memory 100 reaches the usage limit (Yes in S0), the recovery process of the NAND flash memory 100 starts.

<S2>

The NAND flash memory 100 is mounted on the recovery process device 9.

For example, in the recovery process device 9, the control unit 99 causes the attachment/detachment process unit 90 to detach the NAND flash memory 100 from the module substrate Sub of the memory system 1. The control unit 99 causes the attachment/detachment process unit 90 to locate the NAND flash memory 100 on the stage of the recovery process device 9.

<S3>

The cumulative number of annealing processes with respect to the NAND flash memory 100 is checked.

For example, in the recovery process device 9, the control unit 99 instructs the operation execution unit 91 to read the annealing process information AN.

The operation execution unit 91 accesses the ROM block BLK of the NAND flash memory 100 and reads the annealing process information AN from the ROM block BLK. The read annealing process information AN is stored in, for example, the storage unit 98.

The control unit 99 checks the cumulative number of annealing processes indicated by the annealing process information AN in the storage unit 98.

<S4>

The control unit 99 causes the determination unit 94 to determine whether the read cumulative number of annealing processes is less than the upper limit value of the NAND flash memory 100.

<S5>

When the determination unit 94 determines that the cumulative number of annealing processes of the NAND flash memory 100 is the upper limit value (No in S4), the control unit 99 determines that the NAND flash memory 100 is unrecoverable.

Based on this result, the control unit 99 discards the NAND flash memory 100 determined to be unrecoverable without executing the annealing process described below. In this case, the recovery process of the NAND flash memory 100 ends.

<S6>

When the determination unit 94 determines that the cumulative number of annealing processes of the NAND flash memory 100 is less than the upper limit value (Yes in S4), the control unit 99 determines that the NAND flash memory 100 is recoverable.

Accordingly, the control unit 99 checks a deteriorated state of the NAND flash memory 100.

For example, the control unit 99 reads various types of information from the NAND flash memory 100 and executes various types of operations on the NAND flash memory 100. For example, the control unit 99 acquires the total amount of write data of the NAND flash memory 100 from the information read from the NAND flash memory 100. Alternatively, the control unit 99 calculates a bit error rate of the data in the NAND flash memory 100 based on the data writing and the data reading by the operation execution unit 91.

As a certain example for checking the deteriorated state of the NAND flash memory 100, the control unit 99 can check the deteriorated state of the NAND flash memory 100 based on a distribution width of the threshold voltage distribution of the memory cells acquired from the write sequence and the read sequence for the NAND flash memory 100.

In this case, the control unit 99 writes the certain pattern of data to the NAND flash memory 100 by the write sequence. The control unit 99 reads the certain pattern of data written in the NAND flash memory 100 from the NAND flash memory 100 by the read sequence after the lapse of a certain period of time T1 from the data writing.

The control unit 99 calculates the distribution width of the threshold voltage distribution in the certain pattern of data based on the data read from the NAND flash memory 100. When the distribution width is larger than a determination reference, the control unit 99 determines that the characteristics of the NAND flash memory 100 deteriorate (i.e., the NAND flash memory 100 is unusable). For example, the calculated distribution width of the threshold voltage distribution in the certain pattern of data is stored in the storage unit 98.

In this manner, the control unit 99 can estimate the degree of deterioration of the NAND flash memory 100 based on the calculated width of the threshold voltage distribution.

It is noted that the calculation of the distribution width of the threshold voltage distribution for estimating the degree of deterioration may be executed for all the threshold voltage distributions according to the pattern of data storable in the memory cell MT, may be executed for the specific one threshold voltage distribution, or may be executed for the specific plurality of threshold voltage distributions.

For example, the distribution width of the threshold voltage distribution can be calculated and estimated by screening of the threshold voltage of the memory cell MT in a certain voltage range set from two adjacent read voltages by using the well-known read operation, hard bit determination, soft bit determination, and the like.

By these processes, the relative degree of deterioration of each of the films 421, 422, and 423 of the memory cell MT can be obtained. The control unit 99 calculates a deterioration amount of the memory cell MT based on these results.
<S7>

The control unit 99 causes the determination unit 94 to determine whether the deterioration of the memory cell MT is equal to or higher than a reference value based on the acquired information on the deteriorated state of the NAND flash memory 100.
<S8>

When the determination unit 94 determines that the deterioration of the memory cell MT is less than the reference value (No in S7), the control unit 99 recognizes that the NAND flash memory 100 is reusable without the annealing process described below.

In this case, the control unit 99 causes the attachment/detachment process unit 90 to re-attach the NAND flash memory 100 to the module substrate Sub of the memory system 1 without the annealing process.
<S9>

When the determination unit 94 determines that the deterioration of the memory cell MT is equal to or higher than the reference value (Yes in S7), the control unit 99 evacuates various types of information and data in the NAND flash memory 100 to the outside of the NAND flash memory 100.

For example, the operation execution unit 91 accesses the ROM block BLK of the NAND flash memory 100 and reads the ROM information INF including the setting information, the management information, and the annealing process information AN according to an instruction from the control unit 99.

The operation execution unit 91 stores various types of read information AN and INF in the storage unit 98. At this time, the operation execution unit 91 (or the control unit 99) may store the information on the deteriorated state of the NAND flash memory 100 obtained in S6 in the storage unit 98 together with various types of information AN and INF.

It is noted that the operation execution unit 91 may read a user data from the plurality of blocks BLK of the NAND flash memory 100 and store the user data in the storage unit 98 together with various types of information AN and INF.
<S10>

The control unit 99 erases the data of all the memory cells MT of the NAND flash memory 100 after the evacuation of the information AN and INF and the data. The operation execution unit 91 executes the erase sequence on all the blocks BLK including the ROM block of the NAND flash memory 100 according to an instruction from the control unit 99. Accordingly, the data of all the memory cells MT in the NAND flash memory 100 is erased.
<S11>

The control unit 99 causes the annealing process unit 92 to execute the annealing process for recovering the deterioration (characteristics) of the memory cell MT.

The annealing process unit 92 performs an annealing process under predetermined heating conditions on the NAND flash memory 100 that is a recovery process target according to an instruction from the control unit 99. At this time, other package devices P2 and P3 such as a memory controller 200 are separated from the NAND flash memory 100 and located outside the recovery process device 9. Therefore, the memory controller 200 and the power supply system IC of the memory system 1 are not annealed.

For example, the temperature of the annealing process is set to any temperature in a range of 120° C. to 280° C. For example, the time period of the annealing process is set to any applicable time period in a range of 1 hour to 3 days (72 hours). The time period of the annealing process is set according to the temperature used for the annealing process. For example, when the temperature of the annealing process is 250° C., the time of the annealing process is set to a certain time in a range of 2 hours to 3 hours. When the temperature of the annealing process is 125° C., the time of the annealing process is set to a certain time in a range of 1 day to 2 days.

It is noted that the recovery of the deterioration of the memory cell MT can be improved in quality and efficiency by performing the annealing process on the memory cell MT in a data erased state. It is noted that the annealing process may be executed on the NAND flash memory 100 including the memory cell MT in a data programed state without executing the data erasing (S10) for the memory cell MT.

<S12>

The control unit 99 causes the test unit 93 to execute a test process on the annealed NAND flash memory 100.

According to the instruction of the control unit 99, the operation execution unit 91 writes test data to a specific address of the NAND flash memory 100. The operation execution unit 91 reads the written test data from the NAND flash memory 100 after the lapse of the certain period of time T1.

The test unit 93 examines threshold voltage distributions of the plurality of memory cells MT based on the reading result of the test data.

Figure 11:
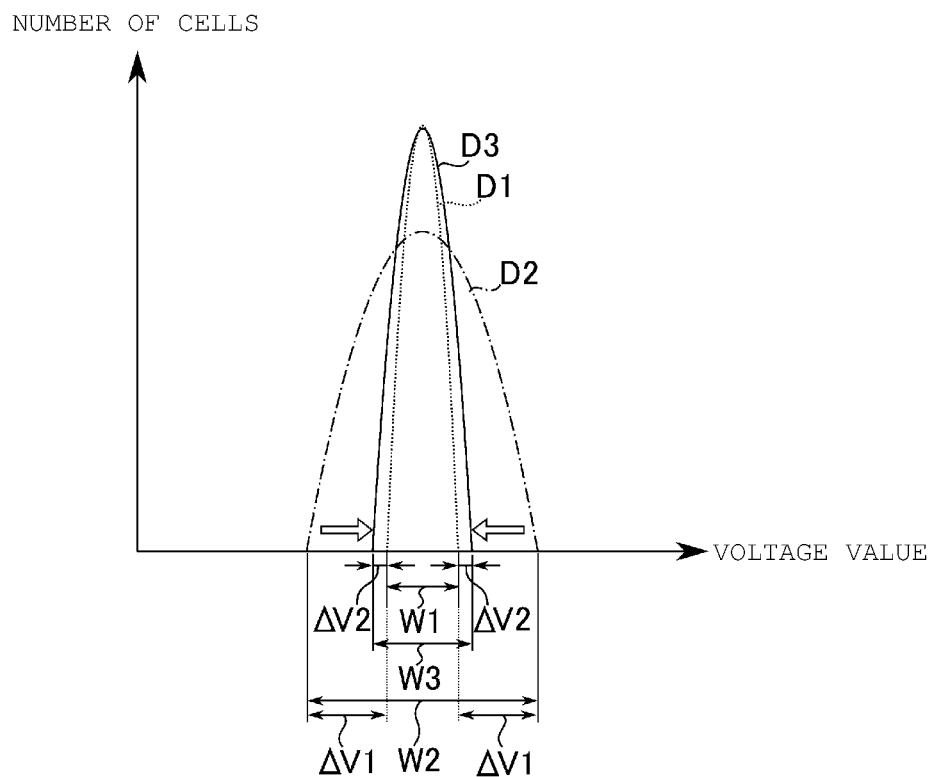
FIG. 11 is a diagram to explain the method for processing the memory system according to the embodiment.

FIG. 11 is a diagram illustrating the relationship between the threshold voltage distribution of the memory cells MT and the state of the memory cells MT.

The horizontal axis of FIG. 11 represents the voltage value of the threshold voltage of the memory cells. The vertical axis of FIG. 11 represents the number of memory cells. FIG. 11 illustrates a threshold voltage distribution D1 of the certain data in the memory cells MT at the start of use (at the time of new shipment) of the memory system 1 after the lapse of the certain period of time (T1) from the writing of the certain data, a threshold voltage distribution D2 of the certain data in the memory cells MT in the deteriorated state, and a threshold voltage distribution D3 of the certain data in the memory cells MT after the recovery process (annealing process).

As illustrated in FIG. 11, the threshold voltage distribution D1 for the certain data obtained from the plurality of memory cells MT at the start of use has a distribution width W1 after the lapse of the period of time T1. For example, the recovery process device 9 stores the distribution width W1 of the threshold voltage distribution D1 for each data latching state as a reference value data.

When the number of P/E cycles increases due to the use of the memory system 1, the deterioration of the characteristics of the memory cells MT occurs due to the defects 999 in the films 421, 422, and 423 as illustrated in FIG. 4 above. After the lapse of the period of time T1 from the time when the certain data is written to the memory cells MT in the deteriorated state, the threshold voltage distribution D2 has a distribution width W2. The distribution width W2 is larger than the distribution width W1 by 2×ΔV1. For example, the value ΔV1 is a difference value between the voltage value at one tail end of the threshold voltage distribution D1 and the voltage value at one tail end of the threshold voltage distribution D2 with respect to a central axis of the threshold voltage distribution D1.

For example, a difference amount of a distribution width of a certain threshold voltage distribution with respect to a distribution width W1 of a threshold voltage distribution D1 of the memory cells MT at the start of use is treated as a deterioration amount of the memory cells MT. In this case, the deterioration amount of the memory cells MT forming the threshold voltage distribution D2 is 2×ΔV1.

For example, the control unit 99 can calculate the deterioration amount (2×ΔV1) of the memory cells MT in the deteriorated state based on the distribution width (for example, the distribution width W1) of the threshold voltage distribution that becomes the reference value by the process of S6.

When the certain data is written to the plurality of memory cells MT after the annealing process of S11, the threshold voltage distribution D3 of the memory cells MT after the annealing process has a distribution width W3. The distribution width W3 is smaller than the distribution width W2. For example, the distribution width W3 is larger than the distribution width W1 by 2×ΔV2. The deterioration amount of the memory cell after the annealing process obtained from the threshold voltage distribution D3 is 2×ΔV2. For example, the value ΔV2 is a difference value between the voltage value at one tail end of the threshold voltage distribution D1 and the voltage value at one tail end of the threshold voltage distribution D3 with respect to the central axis of the threshold voltage distribution D1.

In this manner, the deterioration amount (2×ΔV2) of the memory cells MT after the annealing process is smaller than the deterioration amount (2×ΔV1) of the memory cells MT in the deteriorated state.

Therefore, it is illustrated that the characteristics of the memory cell MT are restored by the annealing process under a predetermined condition.

<S13>

The control unit 99 causes the determination unit 94 to determine whether the result (deterioration amount) of the test process satisfies an allowable value. Accordingly, the control unit 99 checks whether the characteristics of the memory cell MT are restored by the annealing process.

When the determination unit 94 determines that the result of the test process does not satisfy the allowable value (No in S13), the control unit 99 executes the processes from S10 to S12. When it is determined by the test process that the characteristics of the memory cell MT are not restored, the annealing process under the same or different heating condition is performed again on the NAND flash memory 100.

It is noted that, in order to check the recovery of the characteristics of the NAND flash memory 100 in the test process, the test unit 93 and the determination unit 94 may determine whether the distribution width of the threshold voltage distribution obtained from the reading result of the test data is smaller than the distribution width of the threshold voltage distribution obtained from S6.

In this case, in S12, the test unit 93 compares the deterioration amount (2×ΔV2) of the memory cells MT after the annealing process with the deterioration amount (2×ΔV1) of the memory cells MT in the deteriorated state. The test unit 93 may compare the distribution width W3 with the distribution width W2, or may compare the deterioration amount (ΔV2) with the deterioration amount (ΔV1).

In S13, when the deterioration amount (2×ΔV2) is smaller than the deterioration amount (2×ΔV1) (or when the distribution width W3 is smaller than the distribution width W2), the determination unit 94 determines that the characteristics of the NAND flash memory 100 are restored by the annealing process.

The test unit 93 and the determination unit 94 may compare the deterioration amount (2×ΔV2) with a certain value to determine whether the characteristics of the NAND flash memory 100 are restored. When the deterioration amount (2×ΔV2) is less than a certain value, it is determined that the characteristics of the NAND flash memory 100 are restored.

It is desirable that the certain value is calculated and set based on the deterioration amount (2×ΔV1) or the distribution widths W1 and W2.

<S14>

When the determination unit 94 determines that the result of the test process satisfies the allowable value (Yes in S13), the control unit 99 writes various types of information and data stored in the storage unit 98 to the NAND flash memory 100. According to the instruction of the control unit 99, the operation execution unit 91 writes the ROM information INF in the storage unit 98 into the predetermined ROM block BLK.

At this time, the control unit 99 updates the cumulative number of annealing processes in the annealing process information AN. The operation execution unit 91 writes the ROM information INF including the updated annealing process information AN to one or more ROM blocks BLK.

Further, the control unit 99 may update the parameter of the setting information in order to change the function of the NAND flash memory 100. For example, the control unit 99 changes the parameter in order to change the number of bits storable in one memory cell MT. When the memory cell MT before the annealing process is QLC (quad-level cell), the control unit 99 rewrites the parameter of the ROM information INF so that the memory cell after the annealing process becomes TLC (triple-level cell). Accordingly, the number of bits storable in the memory cell MT after the annealing process is smaller than the number of bits storable in the memory cell MT before the annealing process.

In this manner, the ROM information INF such as the setting information and the annealing process information AN can be appropriately changed and written back to the NAND flash memory 100 after the annealing process.

<S15>

The control unit 99 causes the attachment/detachment process unit 90 to detach the NAND flash memory 100 from the recovery process device 9. The control unit 99 causes the attachment/detachment process unit 90 to mount the NAND flash memory 100 in the memory system 1. For example, the attachment/detachment process unit 90 attaches the NAND flash memory 100 to the module substrate Sub of the memory system 1.

It is noted that the NAND flash memory 100 determined to be reused without the annealing process in S8 described above is mounted on the memory system 1 by the attachment/detachment process unit 90.

<S16>

After the mounting of the NAND flash memory 100 on the memory system 1, the control unit 99 ends the recovery process of the NAND flash memory 100.

With the above-described processing flow, the recovery process on the memory system 1 of the embodiment is completed.

(4) Summary

The NAND flash memory executes data writing and data erasing on the memory cell by using the charge tunneling phenomenon due to the application of a relatively large voltage.

As a result, the defects may occur in the members of the memory cells due to the stress caused by the application of voltage and the tunneling of electric charges. The defects cause traps or de-traps of electrons.

As the number of data write/erase cycles (P/E cycles) increases, the number of defects in the memory cell increases. As the result, the deterioration of the characteristics of the memory cell becomes remarkable. When the deterioration of the characteristics of the memory cell exceeds the allowable range for the proper use of the NAND flash memory, the NAND flash memory cannot perform a normal operation, and the memory system including the NAND flash memory becomes unusable.

In the general memory system, not only the NAND flash memory of which operation cannot be executed but also the entire memory system including the memory controller and the electronic components that can continue to be used are replaced with the new memory system.

The memory system 1 according to the embodiment is configured so that the NAND flash memory 100 can be detachable from the memory system 1.

In the embodiment, when the characteristics of the NAND flash memory 100 deteriorate, the annealing process for the detachable NAND flash memory 100 is executed.

Accordingly, according to the embodiment, the characteristics of the NAND flash memory 100 are restored.

Therefore, as the memory system 1 according to the embodiment, a memory system including the reused NAND flash memory 100 can be provided.

In recent years, various contributions are required to achieve a sustainable society such as reduction of emission of carbon dioxide for manufacturing. Under such a situation, the manufacturing of a semiconductor device such as a NAND flash memory requires a lot of power and resources. In addition, the manufacturing of the semiconductor device causes emission of carbon dioxide and exerts a burden on the natural environment.

The memory system 1 according to the embodiment enables the reuse of the NAND flash memory 100 by recovering the characteristics of the memory cell MT by the annealing process. Accordingly, the memory system 1 according to the embodiment can contribute to reduce the consumption of resources and the emission of carbon dioxide for manufacturing a new semiconductor chip such as a NAND flash memory 100.

As described above, according to the embodiment, it is possible to provide a memory system having smaller environmental impacts.

As described above, the memory system 1 according to the embodiment can also reduce a cost to produce a usable memory system.

(5) Application Example

An application example of the memory system 1 according to the embodiment will be described with reference to FIG. 12.

Figure 12:
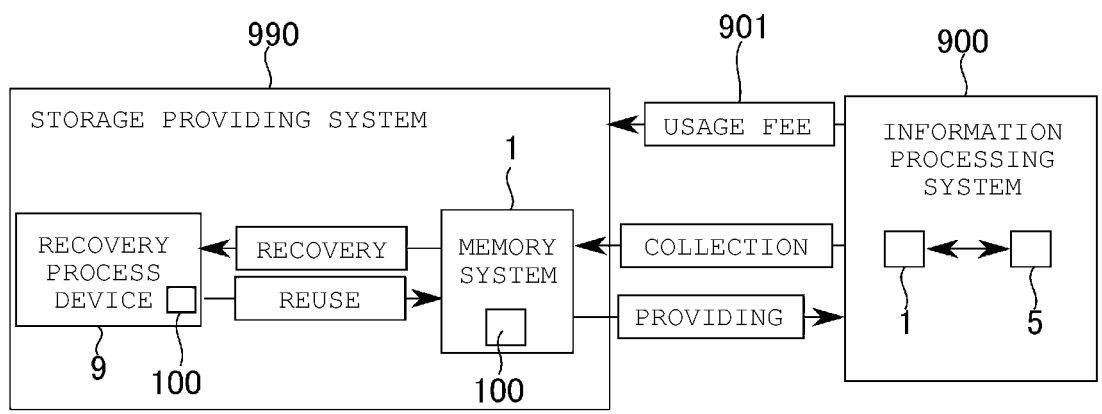
FIG. 12 is a diagram illustrating an application example of the memory system according to the embodiment.

FIG. 12 is a schematic diagram illustrating an application example of the memory system 1 according to the embodiment.

The memory system 1 according to the embodiment is provided to a market and users by subscription.

An information processing system 900 includes the memory system 1 and the host device 5 of the embodiment. The information processing system 900 is a data center, a server, an industrial device, a personal computer, a home electric appliance, a game device, and the like.

A user of the information processing system 900 periodically (or temporarily) pays a usage fee 901 to a storage providing system 990 that provides the memory system 1 in order to use the memory system 1 including the NAND flash memory 100 such as an SSD.

The storage providing system 990 receives the usage fee 901 from the user. The storage providing system 990 provides the user with the memory system 1 of the embodiment according to the received usage fee 901.

The storage providing system 990 may write predetermined data 902 to the memory system 1 before providing the memory system 1 in response to a request from the user. Accordingly, the memory system 1 is provided to the user in a state where the memory system 1 stores the predetermined data 902.

For example, the data 902 written in the memory system 1 in advance by the storage providing system 990 is one or more data selected from a video data, an image data, a text data, an audio data, software (application), and the like.

The storage providing system 990 collects the memory system 1 based on a request from the user, the number of days elapsed from a provision date of the memory system 1, and the like.

The storage providing system 990 executes the processing flow of FIG. 10 described above for the memory system 1. The storage providing system 990 appropriately executes the annealing process for recovering the memory cell MT on the NAND flash memory 100 of the collected memory system 1 by using the recovery process device 9.

The storage providing system 990 reuses the annealed NAND flash memory 100 for the memory system 1.

The storage providing system 990 provides the user with the memory system 1 including the reused NAND flash memory 100.

The user connects the provided memory system 1 to the host device 5. Accordingly, the user uses the information processing system 900 including the memory system 1 of the embodiment.

It is noted that, when providing the memory system 1 including the reused NAND flash memory 100 to the user who is a collection source of the memory system 1, a memory system 1 different from the memory system 1 during the collection may be provided to users who are contracted for the subscription.

As described above, the memory system 1 of the embodiment can be applied to the market with a consumption cycle of a small environmental load.

(6) Others

In the memory system 1 according to the embodiment, the NAND flash memory is exemplified as a memory device used in the memory system 1. It is noted that the memory device used in the memory system 1 according to the embodiment may be a memory device other than the NAND flash memory as long as the characteristics of the memory device can be restored by the annealing process and the memory device can be reused. For example, the memory device may be a NOR flash memory.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of processing a memory system that includes a substrate with a connector and a semiconductor memory chip connected to the connector, the method comprising:

detaching the semiconductor memory chip from the connector;

performing an annealing process with respect to the semiconductor memory chip detached from the connector; and after the annealing process, attaching the semiconductor memory chip to the connector on the substrate.

2. The method according to claim 1, further comprising:

reading first information related to the annealing process from the semiconductor memory chip before the annealing process; and after the annealing process, updating the first information and writing the updated first information into the semiconductor memory chip.

3. The method according to claim 2, wherein the first information is read from a predetermined region of the semiconductor memory chip, and the updated first information is written into the predetermined region of the semiconductor memory chip.

4. The method according to claim 2, wherein the first information includes a number of times the annealing process has been performed with respect to the semiconductor memory chip.

5. The method according to claim 1, further comprising:

reading second information indicating operation voltages of the semiconductor memory chip from the semiconductor memory chip before the annealing process; and after the annealing process, updating the second information and writing the updated second information into the semiconductor memory chip.

6. The method according to claim 5, wherein the second information is read from a predetermined region of the semiconductor memory chip, and the updated second information is written into the predetermined region of the semiconductor memory chip.

7. The method according to claim 5, wherein the operation voltages read before the annealing process indicate a plurality of voltages used for storing data of a first number of bits in a memory cell of the semiconductor memory chip, and the operation voltages in the updated second information indicates one or more voltages used for storing data of a second number of bits in the memory cell, the second number of bits being less than the first number of bits.

8. The method according to claim 1, further comprising:

reading user data from the semiconductor memory chip before the annealing process; and after the annealing process, writing the user data into the semiconductor memory chip.

9. The method according to claim 1, wherein the annealing process is performed at a temperature in a range that is 125° C. or higher and 250° C. or lower and for a duration of a range that is 1 hour or longer and 3 days or shorter.

10. The method according to claim 1, wherein a width of a threshold voltage distribution, which corresponds to a certain bit value, of memory cells of the semiconductor memory chip after the annealing process is narrower than a width of the threshold voltage distribution of the memory cells before the annealing process.

11. The method according to claim 1, wherein the semiconductor memory chip is a NAND flash memory.

12. The method according to claim 1, wherein the semiconductor memory chip has a ball grid array (BGA) structure that is connected to the connector on the substrate.

* * * * *